(12) United States Patent
Morishita et al.

(10) Patent No.: US 6,311,966 B1
(45) Date of Patent: Nov. 6, 2001

(54) WORKPIECE ABSORPTION CARRIER UNIT AND ABSORPTION HEAD

(75) Inventors: Akio Morishita, Inuyama; Ryoichi Furuhashi; Kazuyuki Toda, both of Aichi-ken; Akiyoshi Ochiai, Komaki, all of (JP)

(73) Assignee: Akio Morishito (JP)

( * ) Notice: Subject to any disclaimer, the term of this patent is extended or adjusted under 35 U.S.C. 154(b) by 0 days.

(21) Appl. No.: 09/420,116

(22) Filed: Oct. 18, 1999

(30) Foreign Application Priority Data

Oct. 19, 1998 (JP) .................................................. 10-315413
Oct. 19, 1998 (JP) .................................................. 10-315414

(51) Int. Cl.[7] .................................................. B25B 11/00

(52) U.S. Cl. ................................ 269/21; 269/22; 451/388

(58) Field of Search .............................. 451/388; 269/21, 269/22

(56) References Cited

U.S. PATENT DOCUMENTS

| | | | | |
|---|---|---|---|---|
| 3,961,752 | * | 6/1976 | Doeksen ...................................... | 239/1 |
| 5,464,474 | * | 11/1995 | Nishimoto et al. .................. | 118/676 |
| 5,975,183 | * | 11/1999 | Reis et al. ............................. | 156/580 |

* cited by examiner

Primary Examiner—Joseph J. Hail, III
Assistant Examiner—Daniel Shanley
(74) Attorney, Agent, or Firm—Richard P. Gilly

(57) ABSTRACT

A head support rest 29 is provided with machine bodies 21, 25 being movable and drivable in a horizontal direction, being free to go up and down. One or more absorption means aggregates 550 are provided with the head support rest 29, being free to move and position in a horizontal two-dimensional direction through a horizontal direction moving structure 33, 35, 36, 47, 49, 51 and 52. The absorption means aggregate 550 has a plurality of absorption means 55 provided such that absorption portions 57 are adjacent to one another. Absorption driving means 60, 62, 63, 65 are connected with each of absorption means 55. Then, a fine workpiece having complex shape can be also appropriately absorbed and carried.

10 Claims, 14 Drawing Sheets

WORKPIECE ABSORPTION CARRIER UNIT AND ABSORPTION HEAD

BACKGROUND OF THE INVENTION

This invention relates to a workpiece retention carrier unit with a suction head, for using when a workpiece in the shape of a plate, for instance, is retained and carried with a laser beam machining equipment or the like.

In the past, when a workpiece in the shape of a plate, for instance, is retained and carried in a laser beam machining equipment or the like, a retention carrier unit having a suction head using vacuum pads or the like has been used.

However, the workpiece after machining has various kinds of shapes. Especially, in case of the workpiece having complex shape, it is difficult to retain and carry the workpiece since, oftentimes the position of the vacuum pad cannot be successfully fitted in the shape of the workpiece. In addition, in the case of the workpiece having a fine part, the vacuum pad may not make sufficient contact with the workpiece. So, effective suction force cannot be generated and it is difficult to retain and carry.

Furthermore, when the retained workpiece is carried to a narrow place, such as just beside the pile of workpieces already piled, a problem may be encountered in that the suction head interferes with the pile of workpieces, and thus the workpiece cannot be successfully carried.

Accordingly, taking the above-mentioned circumstances into consideration, the object of the present invention is to provide a workpiece retention carrier unit and a suction head, capable of appropriately retaining even complex and finely-shaped workpieces. Furthermore, preferably, the object of the present invention is to provide a suction head capable of appropriately carrying workpieces to a narrow place.

SUMMARY OF THE INVENTION

In order to solve the above-mentioned problems, the invention of claim 1 of the present invention is a workpiece retention carrier unit, comprising:
- a machine body being free to move and drive at least in a horizontal direction;
- a head support rest provided with said machine body, being free to raise,
- one or more retention means aggregates provided with said head support rest, being free to move and position in a horizontal two-dimensional direction through a horizontal direction moving structure;
- said retention means aggregate having a plurality of retention means provided such that retention portions are adjacent to one another; and
- a retention driving means connected with each of said retention means.

With this structure, one or more than one retention means aggregates are provided, being free to move and position in a horizontal two-dimensional direction through the horizontal direction moving structure. Then, even if the workpiece to be retained and carried is one having complex shape, the workpiece can be retained and carried with no problem in such a manner that the retention means aggregates are matched with the shape of the workpiece so as to move and position in a horizontal two-dimensional direction. Besides, the retention means aggregate has a plurality of retention means provided such that the retention portions are adjacent to one another, and the retention driving means is connected with each of the retention means. That is, the retention of the workpiece can be separately performed by each retention means. Even if the workpiece to be retained and carried has a fine part and some retention portions of the retention means aggregate are out of the fine part of the workpiece, for instance, the retention of the workpiece can be effectively performed through the remainder retention portions positioning on this workpiece without getting out, so the workpiece can be retained and carried with no problem. In this way, in the workpiece retention carrier unit according to the present invention, even fine complex workpiece can be appropriately carried.

Besides, the invention of claim 2 of the present invention is the workpiece retention carrier unit according to the invention of claim 1 wherein a plurality of said retention means aggregates are provided, and these plural retention means aggregates are free to individually move and position in a horizontal two-dimensional direction through said horizontal direction moving structure.

Then, a plurality of retention means aggregates are provided, being free to separately move and position in a horizontal two-dimensional direction. Therefore, in addition to the effects of the invention of claim 1, a plurality of retention means aggregates can be positioned with various location patterns, so the workpiece having more complex shape can be retained and carried. Then, complex retained and it is very convenient.

Besides, the invention of claim 3 of the present invention is the workpiece retention carrier unit according to the invention of claim 1 wherein respective retention means of said retention means aggregate are supported, being free to respectively individually move in up and down direction.

Then, in addition to the effects of the invention of claim 1, effects can be exercised when the retained workpiece is brought down at a narrow place so as to be delivered to the pallet or the like. That is, in this case, the retention means which does not retain the workpiece may hit another hindrance during going down. But, each retention means is free to move in up and down direction, separately. Then, while the retention means which hit a hindrance stops going down as it is, the retention means retaining the workpiece goes down without hindrance and the retained workpiece can be delivered to the pallet or the like with no problem. So, it is very convenient. Then, the end portion of the workpiece in the shape of a plate, positioned near another workpiece or a part of the classification head, can be retained.

The invention of claim 4 of the present invention is the workpiece retention carrier unit according to the invention of claim 1 wherein said retention driving means has an retention control means for intermittently controlling retention state of each retention means.

Then, in case where some retention portions of the retention means aggregate get out of the workpiece, the retention state of the retention means is cut off through the retention control means only concerning the retention means of the retention portion getting out of the workpiece. Then, in addition to the effects according to the invention of claim 1, using vain energy by operating the retention means by which effective suction force can not generate to the workpiece is avoided and the saving of the energy is realized. Furthermore, the inconvenience of retaining dust excluding the workpiece by the retention means can be removed, so, it is very convenient.

The invention of claim 5 of the present invention is the workpiece retention carrier unit according to the invention of claim 1 wherein said horizontal direction moving structure has a frame provided with said head support rest, being free to rotate and position, an arm provided with said frame, being free to rotate and position and a head putting portion for putting said retention means aggregates, provided with said arm, being free to move and position in a horizontal direction.

Then, each retention means aggregate can be moved and positioned in a horizontal two dimensional direction by rotating and positioning the frame with respect to the head support rest, and by rotating and positioning the arm with respect to the frame, and by moving and positioning the head putting portion with respect to the arm in a horizontal direction, and then, can be positioned at various positions in the horizontal plane. Therefore, in addition to the effects according to the invention of claim 1, the workpiece having more complex shape can be also retained and carried, so it's convenient.

The invention of claim 6 of the present invention is a suction head, comprising:

a head body;

a plurality of retention means, provided with said head body;

a slide portion in the shape of a bar provided with each of said retention means, movably supported in an axial center direction with respect to said head body, being independent of another retention means;

a retention portion densely located, being adjacent to one another in non-retention state of an object, provided with a top end of each of said slide portions;

an air retention means connected with each of said retention portions; and an intermittent retention control means provided with said air retention means, capable of individually on-off controlling of retention operation of air to each of said retention portions.

That is, the suction head has the retention portions densely provided, adjacent to one another, and the air retention means is connected with each of these retention portions. Then, the retention of the workpiece can be separately performed by each of the retention portions. Then, even if the object of retention is a fine complex workpiece and some retention portions of the suction head get out of the fine part of the workpiece, the retention of the workpiece can be effectively performed through the remainder retention portions positioning on this workpiece without getting out. So, the workpiece can be retained with no problem. That is, according to the present invention, even the workpiece having complex and fine shape can be appropriately retained. When the retained workpiece is carried to a narrow place, such as just beside the pile of the workpieces already piled, the retention means which do not retain the workpiece may hit the hindrance, such as the pile of another workpiece during movement. Since the slide portion of each retention means is free to move, separately from other retention means. Therefore, while the retention means which hit a hindrance, stop moving in the hit state, the retention means retaining the workpiece move without difficulty and the retained workpiece can be carried to the position to be carried with no problem. In this way, in the present invention, the workpiece can be appropriately carried to a narrow place, also. Furthermore, in the present invention, when some retention means get out of the workpiece, for instance, the retention operation of air to the retention portion of the retention means is turned off only concerning the retention means getting off the workpiece through the intermittent retention control means so as to cut off the retention state in the retention portion. By doing so, using vain energy by operating the retention means by which effective suction force does not generate to the workpiece is avoided, and the saving of the energy is realized. Furthermore, the inconvenience of retaining dust excluding the workpieces by the retaining means can be removed, so it I s convenient.

Besides, the invention of claim 7 of the present invention is the suction head according to the invention of claim 6 wherein said slide portion in the shape of a bar is formed in the shape of a hollow tube, having air path therein, and said air path comprises a part of said air retention means for retaining air from each of said retention portions.

Then, in addition to the effects according to the invention of claim 6, since the slide portion serves a part of the air retention means, saving of the member is possible. So, it's very convenient. Besides, since there is no pipe arrangement in the retention portion, excluding the slide portion, it never happens that such a pipe arrangement interferes with the workpiece or the like. Then, it's convenient.

Besides, the invention of claim 8 of the present invention is the suction head according to the invention of claim 6 wherein each of said retention portions is supported, rotatably in all direction with respect to said slide portion in the shape of a bar.

Then, in case of even the workpiece having an irregular portion by pressing machining or the like (not shown), each retention portion is appropriately rotated and moved with respect to the surface having the irregular portion so as to match. Then, effective suction force can be generated between these retention portion and the workpiece. Therefore, in addition to the effects according to the invention of claim 6, the retention of the workpiece having an irregular portion is possible, so, it's very convenient.

Besides, the invention of claim 9 of the present invention is the suction head according to the invention of claim 6 wherein a moving means of said head body is provided with said head body.

Then, since the suction head can be moved to an appropriate retention position in the workpiece by moving the head body by the moving means so as to fit in the shape of complex workpiece, the retention of more complex workpiece is possible, in addition to the effects according to the invention of claim 6. So, it's very convenient.

Besides, the invention of claim 10 of the present invention is the suction head according to the invention of claim 6 wherein each of said retention portions has a cover means for covering each of said retention portions and a taper portion is formed on said head body side of said cover means.

Then, in addition to the effects of the invention of claim 6, hitting one another by a plurality of retention portions to be damaged is avoided with the cover means. Besides, inadvertently retaining outside dust and the like when suction force is generated in the retention portion is avoided. Besides, when the positions of the retention portions adjacent to each other are shifted in the axial direction, thereafter, one retention portion shifted is moved through its slide portion by moving the head body side, and the positions of the retention portions adjacent to each other are matched with each other again, the end side of one cover means hits the taper portion of the other cover means and slidably moved along this taper shape. So, catching the cover means each other is avoided. Then, it's convenient.

BRIEF DESCRIPTION OF THE DRAWINGS

FIG. 5 is a view obliquely seen, showing a suspension frame and a head unit and the like;

DESCRIPTION OF THE PREFERRED EMBODIMENT

Embodiments of the present invention will now be described hereinafter with respect to the accompanying drawings.

Figure 1:
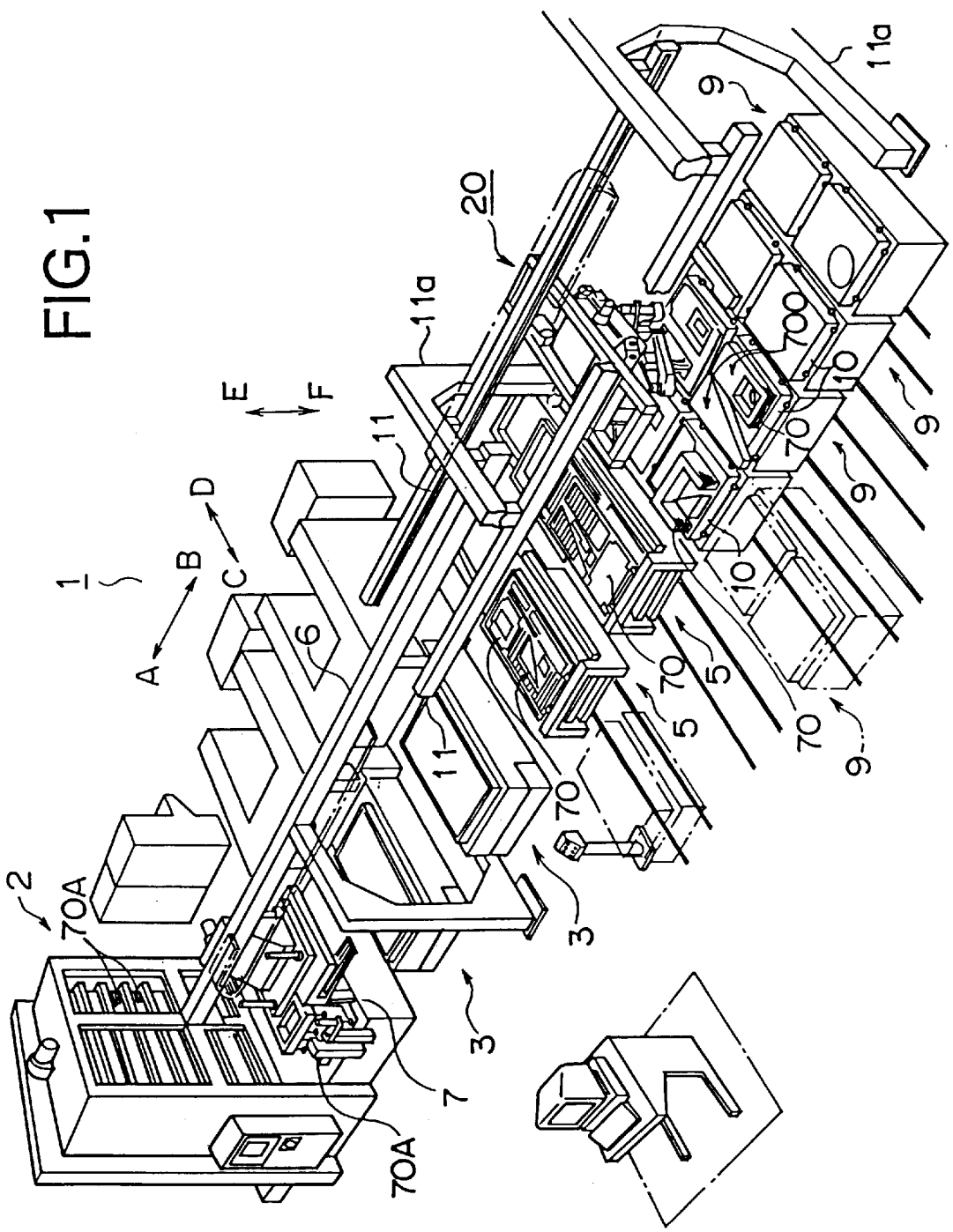
FIG. 1 is a view obliquely seen, typically showing the whole laser beam machining equipment.

As shown in FIG. 1, a laser beam machining equipment 1 has a well-known raw material stocker 2, which piles and stores a lot of raw material workpieces 70A in the shape of a plate, and from which the raw material workpiece 70A to be machined can be appropriately taken out of a lot of raw material workpieces 70A piled and stored. With the side of the raw material stocker 2 (the right side of the paper of FIG. 1 two well-known laser beam machines 3, capable of cutting and machining the above-mentioned raw material workpiece 70A with laser beam are provided (the number of the laser beam machine 3 may not be two). With the side rather than the two laser beam machines 3, 3 (the right side of the paper of FIG. 1), two well-known classification heads 5, capable of locating a machined workpiece 70 cut and machined by the laser beam machine 3 thereon, are provided (the number of the classification head 5 may not be two). Then, the raw material stocker 2, the laser beam machines 3, 3, and the classification heads 5, 5 are located in a predetermined horizontal carrier direction (the direction as shown by the arrows A and B of the figure) in a row.

On the upper hand of the raw material stocker 2, the laser beam machines 3, 3 and the classification heads 5, 5, a guide rail 6 is provided, extending in the above-mentioned carrier direction (the direction as shown by the arrows A and B of the figure), so as to mutually communicate among the raw material stocker 2, the laser beam machines 3, 3 and the classification heads 5, 5. A carrier robot 7 is provided with the guide rail 6, being free to move and drive in the carrier direction (the direction as shown by the arrows A and B) along the guide rail 6. This carrier robot 7 is well-known, and can carry the raw material workpiece 70A from the raw material stocker 2 to each laser beam machine 3 through a vacuum pad, and can carry the machined workpiece 70 from each laser beam machine 3 to each classification head 5 through a fork or the like.

On the other hand, a plural number of well-known workpiece stockers 9 are provided with the side rather than two classification heads 5, 5 (the right side of the paper of FIG. 1, that is, the side of the arrow B of figure), aligning and locating along the carrier direction (the direction as shown by the arrows A and B) (In the present embodiment, four workpiece stockers are provided, but its number may not be four.). On each workpiece stocker 9, a pallet 10 in the shape of a plate is attachably and detachably provided, which can pile and locate a plural number of machined workpieces 70 as well as can locate and align workpiece piles 700 made by piling many machined workpieces 70. As shown FIG. 1, on the upper hand of the classification heads 5, 5 and the plural number of workpiece stockers 9, a pair of guide rails 11, 11, which are parallel to each other, are located through appropriate support members 11a, 11a, extending in the carrier direction (the direction as shown by the arrows A and B in the figure) so as to mutually communicate among the classification heads 5, 5 and a plural number of workpiece stockers 9. A palletizing robot 20 is provided with these guide rails 11, 11.

Figure 2:
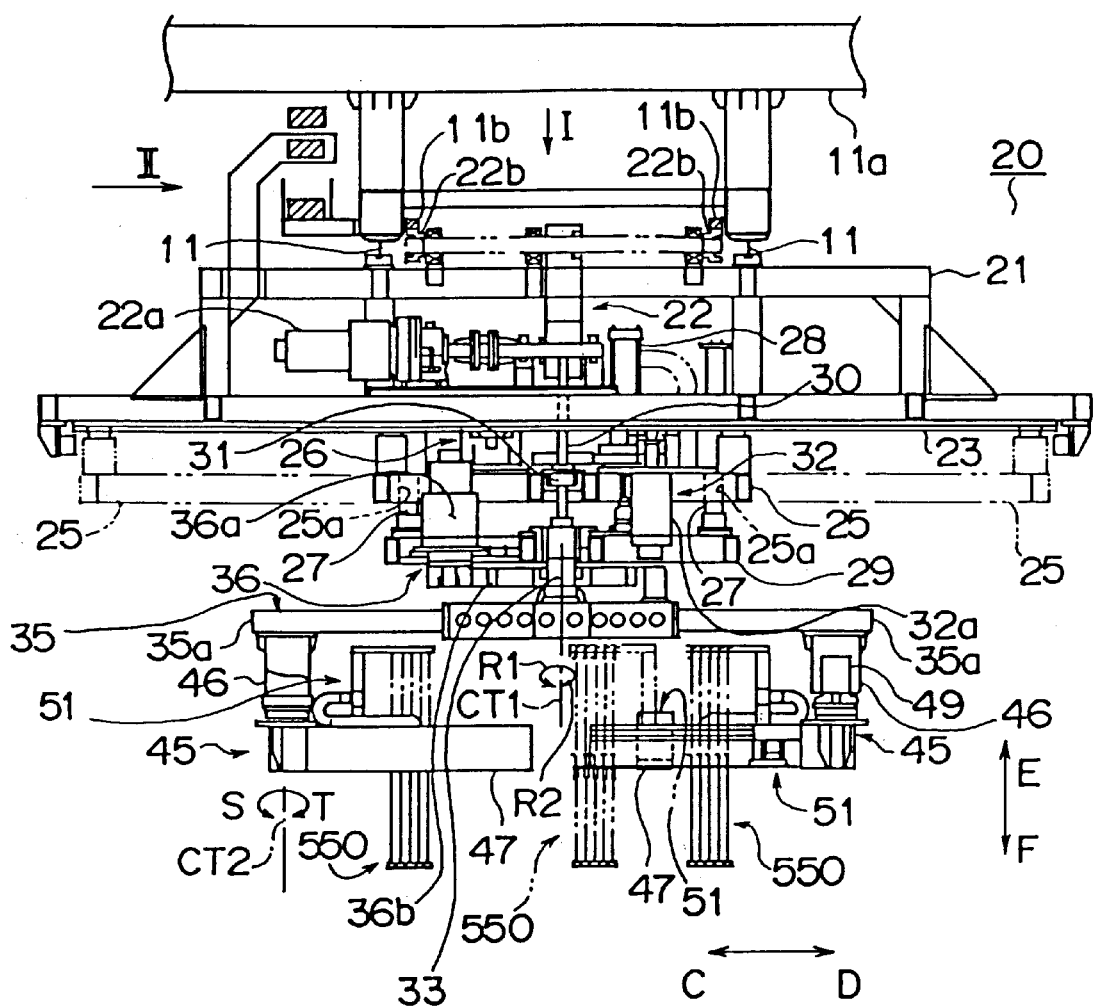
FIG. 2 is a side sectional view showing a workpiece retention carrier unit of the present invention, also referred to as a palletizing robot.
Figure 3:
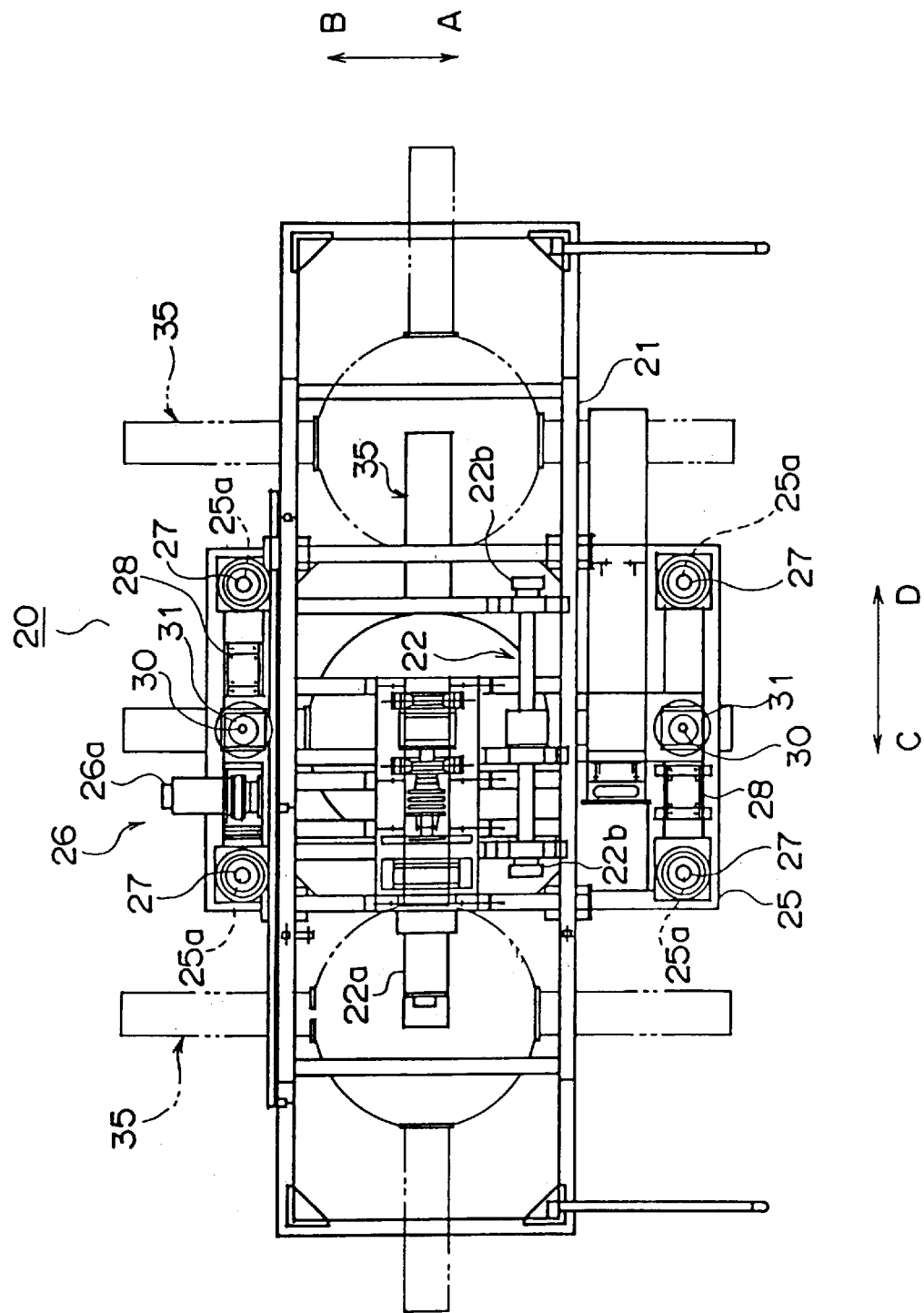
FIG. 3 is a view seen from the arrow I of FIG. 2.
Figure 4:
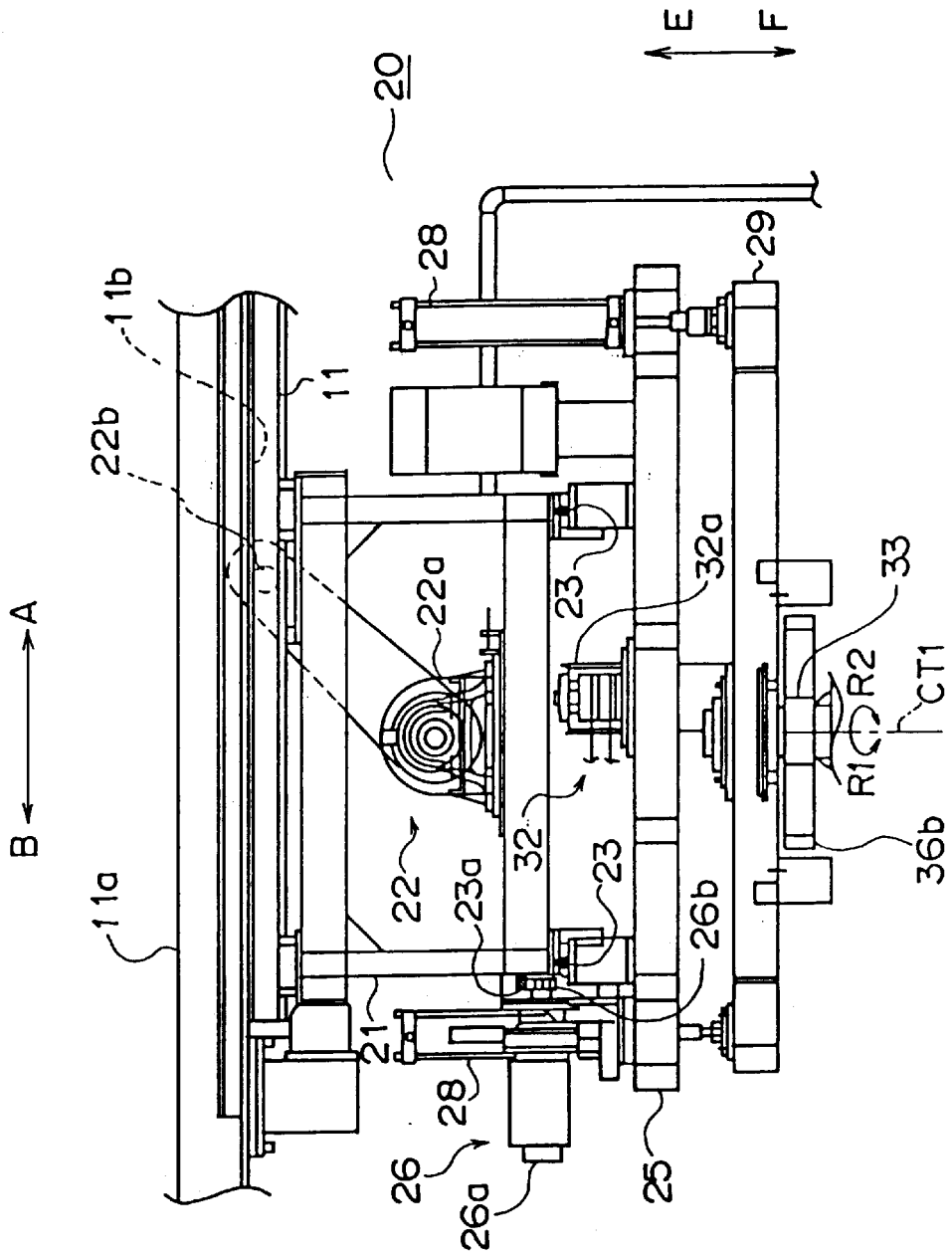
FIG. 4 is a view seen from the arrow II of FIG. 2 (sectional view in part)

As shown in FIGS. 2 through 4 (but, the guide rails 11, 11 are omitted in FIG. 4), the palletizing robot 20 has a suspension frame 21, being suspended by the guide rails 11, 11. And, the suspension frame 21 is free to move in the carrier direction (the direction as shown by the arrows A and B) along the guide rails 11, 11. A travel driving unit 22, which is comprised of a motor 22a and gears 22b, 22b rotated and driven by the motor 22a, is provided with the suspension frame 21. Besides, racks 11b, 11b are provided with the support member 11a along the guide rails 11, 11. Each gear 22b of the travel driving unit 22 is engaged with each rack 11b.

A pair of movement rails 23, 23, which are parallel to each other, are provided with the suspension frame 21, extending in the direction as shown by the arrows C and D in the figure, which is the horizontal direction, making right angle with the carrier direction (the direction as shown by the arrows A and B). A first frame 25 is provided with these movement rails 23, 23 so as to be suspended, and the first frame 25 is free to move in the direction as shown by the arrows C and D along the movement rails 23, 23. A move driving unit 26, which is comprised of a motor 26a and a gear 26b rotated and driven by the motor 26a and the like, is provided with the first frame 25, as shown in FIG. 4. And, a rack 23a is provided with the suspension frame 21 along the movement rail 23. The gear 26a of the move driving unit 26 is engaged with the rack 23a.

A plurality of guide holes 25a are formed on the first frame 25, penetrating in up and down direction, as shown in FIG. 2 (In the present embodiment, four holes are formed as shown in FIG. 3). As shown in FIGS. 2 and 3, a rod 27 extending in up and down direction is slidably inserted into each guide hole 25a. A second frame 29 is connected with the lower end side of these rods 27, then, this second frame 29 is free to move in the up and down direction (the direction as shown by the arrows E and F of the figure) with respect to the first frame 25. As shown in FIGS. 2 through 4, balancers 28 (two balancers in the present embodiment) which are air pressure cylinders units are provided between the first frame 25 and the second frame 29. The load of the second frame 29 side is supported in the first frame 25 by this balancer 28. Screw members 30 in the shape of a bar (two screw members in the present embodiment), extending in the upper direction are provided with the second frame 29, penetrating the first frame 25, as shown in FIG. 2 or 3. Nut members 31 (two in the present embodiment) are provided with the first frame 25 so as to fix only in the up and down direction with respect to the first frame 25. These respective nut members 31 are engaged with the respective screw members 30 so as to comprise a ball screw unit.

Furthermore, a motor 32a and a nut driving unit 32 capable of rotating and driving the respective nut members 31 by the power from the motor 32a are provided with the first frame 25. Besides, an axis 33 extending in the up and down direction so as to project in the lower direction rather than the second frame 29 (the direction as shown by the arrow F) is provided with the second frame 29, being free to axially rotate in the direction as shown by the arrows R1 and R2 with the rotational axis CT1 extending in up and down direction as its center. A suspension frame 35 is suspended on the lower end side of the axis 33. Between the second frame 29 and the axis 33, a rotation driving unit 36 is provided. As shown in FIG. 2, the rotation driving unit 36 is comprised of a motor 36a provided on the second frame 29 side and a pulley 36 rotated and driven by the motor 36a through a belt or the like, and this pulley 36b is fixedly provided with the axis 33. And, the axis 33 can be rotated and driven in the direction as shown by the arrows R1 and R2 by the rotation of the pulley 36b.

Figure 5:
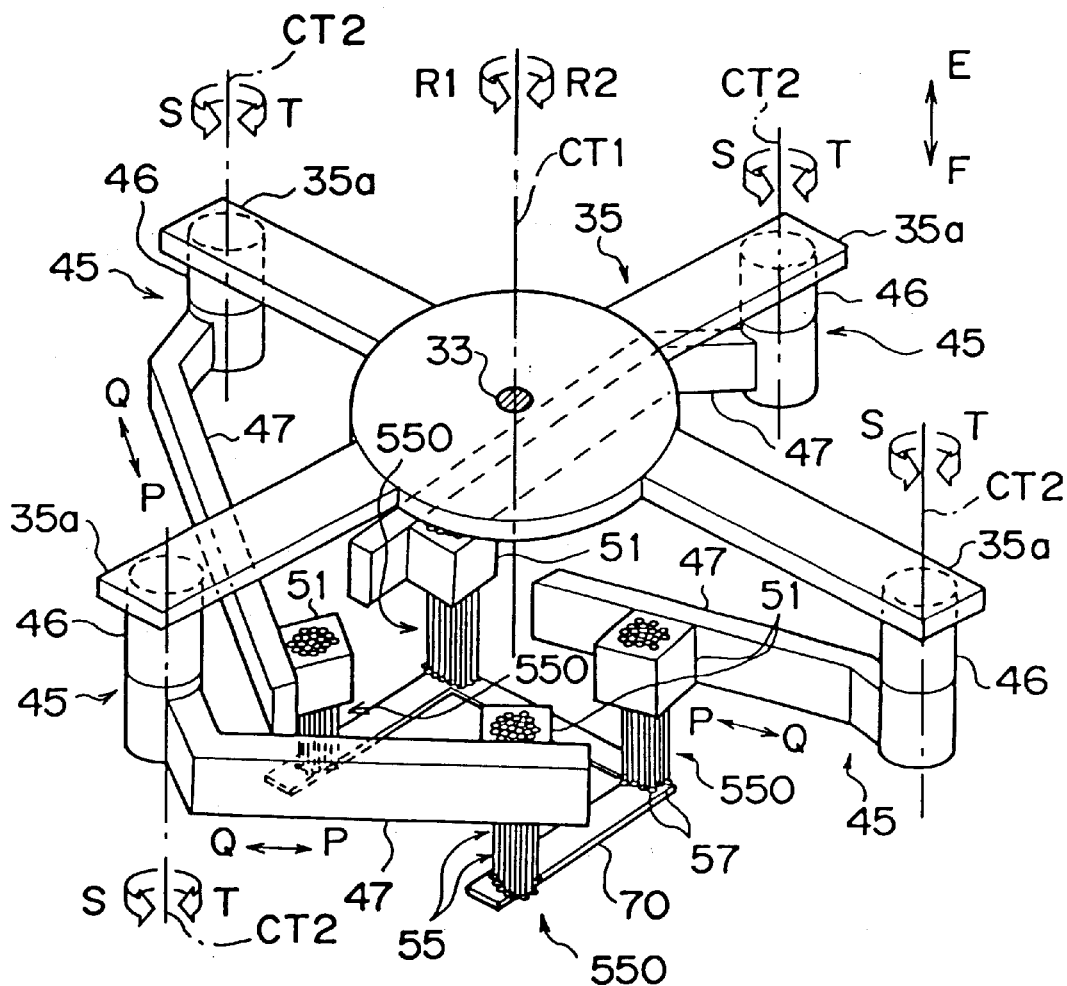
Figure 6:
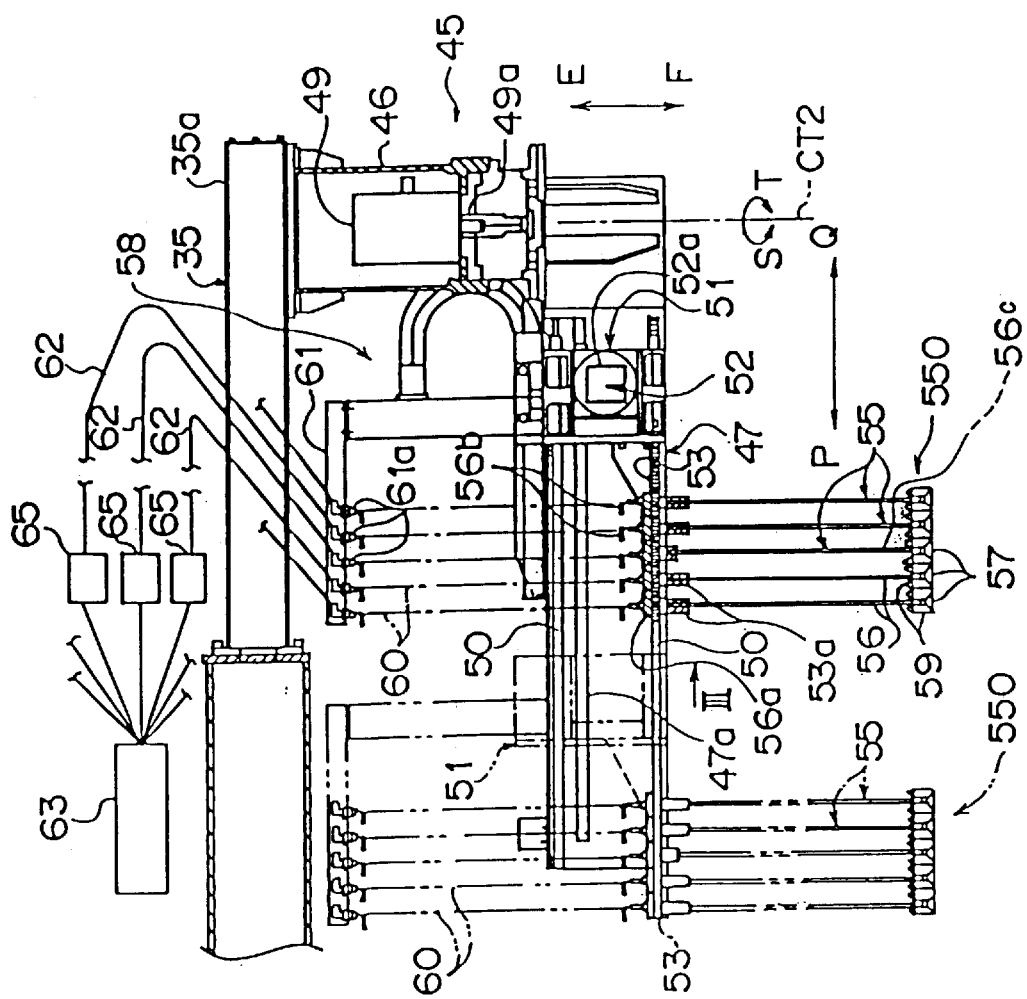
FIG. 6 is a side view showing one of the head units in detail (sectional view in part)
Figure 8:
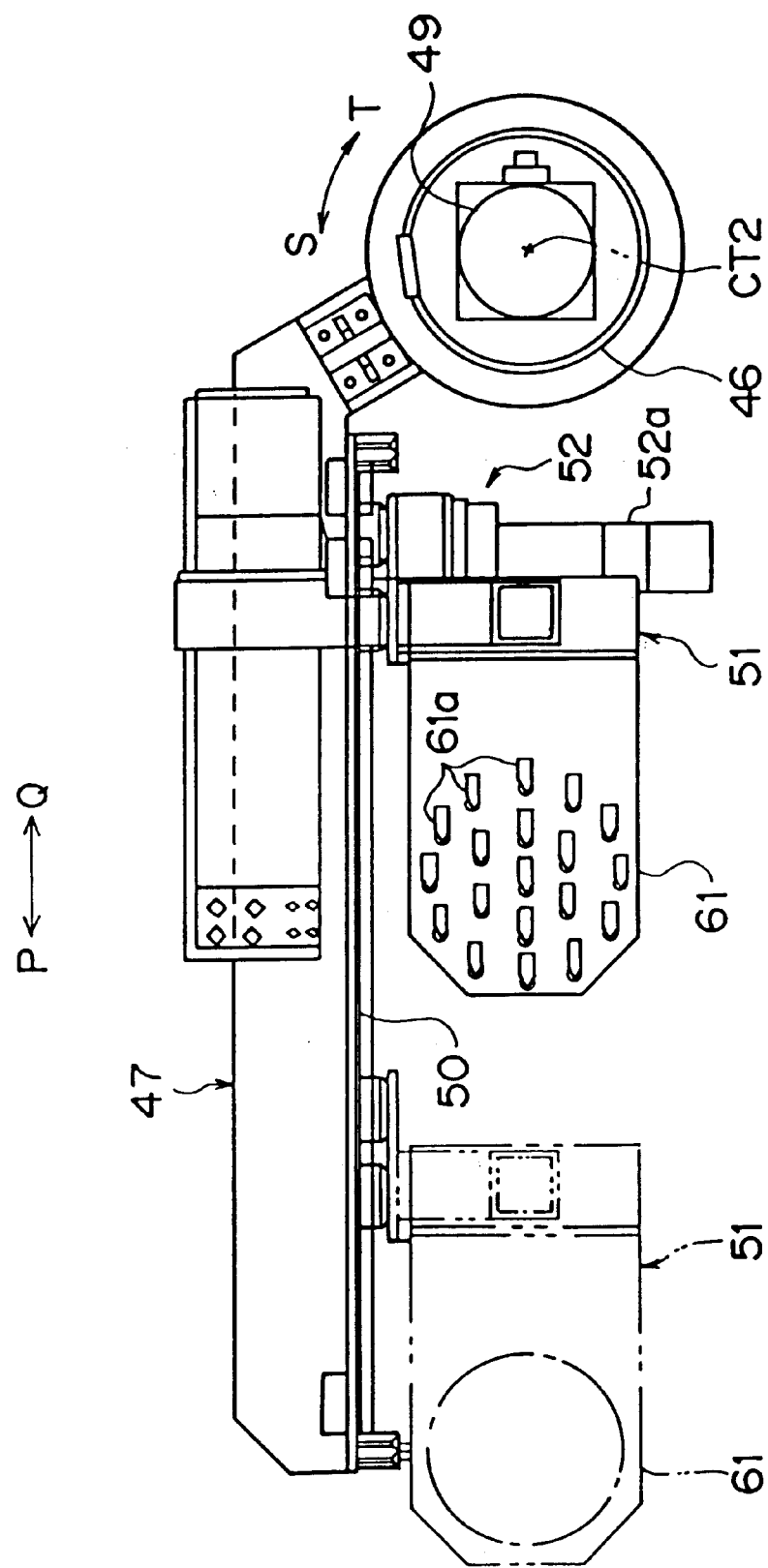
FIG. 8 is a view showing the head unit, seen from the upper (sectional view in part)

The suspension frame 35 of the present embodiment is basically in the shape of almost level plate and the plane is in the shape of almost cross, as shown in FIGS. 2 and 5. A head unit 45 is provided with each end portion 35a near the end of the four arm portions in the shape of a cross of the suspension frame 35 (The shape of the suspension frame 35 is optional, and one or more head units 45 may be provided.). As shown in FIG. 5, 6 or 8, each head unit 45 has a bracket 46 fixed on the lower side of the end portion 35a, and an arm 47 which is level and almost straight is provided with the bracket 46, being free to rotate in the direction as shown by the arrows S and T in the figure with the rotational axis CT2 extending in the up and down direction (the direction as shown by the arrows E and F) as its center. On this occasion, a driving motor 49 is provided with the bracket 46 portion. And, the side of an output axis 49a of this driving motor 49 is coaxially located with the rotational axis CT2 and is connected with the arm 47.

Rails for sliding 50, 50 are provided with the arms 47, extending in the direction as shown by the arrows P and Q in the figure (level direction) which is the extending direction of the arm 47 along the arm 47. A suction head 58 is provided through the rails for sliding 50, 50. The suction head 58 has a head frame 51, being free to slide in the direction as shown by the arrows P and Q along the rails for sliding 50, 50 (In FIG. 5, the rail for sliding 50 is omitted for simplification and the head frame 51 and the like are simply shown in the shape of a rectangular.) A slide driving unit 52, comprised of a motor 52a and a gear 52b rotated and driven by the motor 52a is provided with the head frame 51. A rack 47a is provided with the arm 47 along the arm 47. The gear 52b of the slide driving unit 52 is engaged with this rack 47a.

Figure 7:
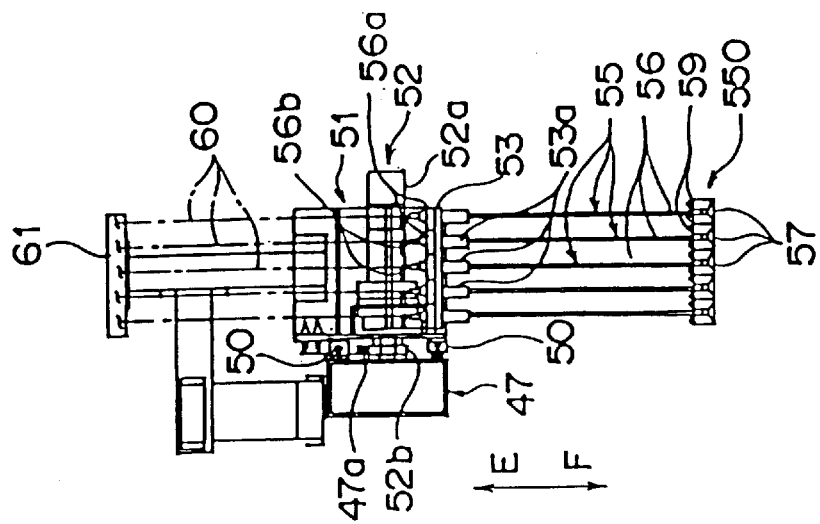
FIG. 7 is a view seen from the arrow III of FIG. 6 (sectional view in part)
Figure 9:
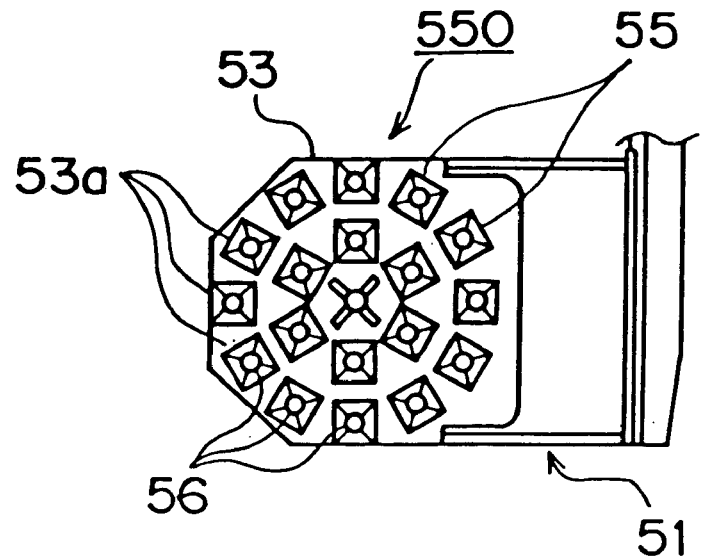
FIG. 9 is a top view showing only a head support portion of a head frame.

As shown in FIGS. 6, 7 and 9, a head support portion 53 in the shape of a level plate is formed on the head frame 51. A plurality of retention sets 55 (Although the number in the present embodiment is 19, the number is not always 19 and two or more may be provided.) are supported by the head support portion 53 through bushes 53a extending in the up and down direction. A plurality of retention sets 55 supported by one head support portion 53 comprises an retention set aggregate as a bundle. Each retention set 55 has a tube body 56 in the shape of a bar, extending in up and down direction, and this tube body 56 penetrates the head support portion 53 through the bush 53a and the like. That is, the tube body 56 is free to slide in the up and down direction (the direction as shown by the arrows E and F) with respect to the head support portion 53. A stopper 56a having the size so as not to pass through the bush 53a, is provided at the portion near the top end of the tube body 56. The tube body 56 is supported by the head support portion 53 such that this stopper 56a is on the head support portion 53 so as to stop the head support portion 53 by the stopper 56a.

As shown in FIGS. 6, 7, 10, 11, pads 57 in the shape of a cone, which are vacuum pads, are provided, facing the lower hand (the direction as shown by the arrow F) with the lower end of the tube bodies 56. Besides, pad protecting members 59 (The pad protecting members 59 are shown with two-dot chain line concerning only a part of the retention sets 55 in FIG. 11 for simplification.) in the shape of almost a cylinder, open in the lower direction, are provided at the portion near the lower end of the tube body 56, covering and protecting the periphery of the side of the pad 57. The upper side portion of the pad protecting member 59 is a taper portion 59a in the shape of a taper, making itself thinner for the upper hand. On this occasion, the inside of the pad 57 is connected and communicated with an air path 56c (FIG. 6) which is the inside of the tube body 56 through the lower end of the tube body 56. Tubes 60 (are shown with a straight line, such as a dashed line in respective figures for simplification), which are expandable spiral tubes, are connected with the upper end side of the tube bodies 56 through joints 56b, communicating these air paths 56c and the inside of the tube 60 with each other.

Figure 10:
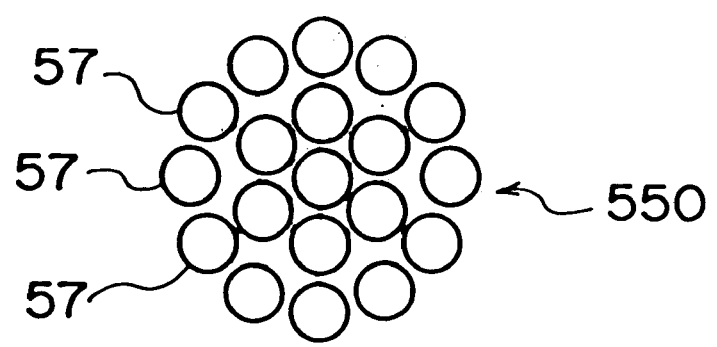
FIG. 10 is a view showing an aggregate, seen from the lower.

And, as shown in FIGS. 6 through 8, a horizontal tube support portion 61 in the shape of a plate is provided with the head frame 51, facing the head support portion 53 in the upper and lower direction above the head support portion 53. The end portion of the tube 60 of each retention set 55 is connected with and supported by this tube support portion 61 through an appropriate joint 61a (which is omitted in FIG. 7). By doing so, it never happens that many tubes 60 might be twined. On this occasion, a pressure transfer member 62 which is comprised of another tube is connected with each tube 60 through the joint 61a. The top end of the pressure transfer member 62 is connected with a vacuum pump 63 (The pressure transfer member 62 and the vacuum pump 63 are shown only in FIG. 6.). During each pressure transfer member 62, a valve 65, free to open and close the inside of the pressure transfer member 62, is provided as shown in FIG. 6. Each valve 65 is selectively free to be driven by a predetermined valve driving unit which is not shown. The retention set aggregate 550 which is comprised of a plurality of retention sets 55 are densely located, adjacent to each other such that these pads 57 form circular outline, as shown in FIG. 10.

The laser beam machining equipment 1 and the palletizing robot 20 are comprised as explained before. Then, the machining and the classification of a workpiece with the laser beam machining equipment 1 advance as shown in the following. That is, as shown in FIG. 1, the raw material workpieces 70A, which are stored and piled at the raw material stocker 2, are taken out in order, and the raw material workpieces 70A taken out are carried to each laser beam machine 3 in order by the carrier robot 7. The raw material workpieces 70A carried in order are cut and machined in order at each laser beam machine 3, and the machined workpieces 70 finished machining at each laser beam machine 3, are carried to each classification head 5 in order by the carrier robot 7. On the other hand, the machined workpieces 70 carried to each classification head 5 are carried on each pallet 10 of each workpiece stocker 9 in order through the palletizing robot 20 with the routines explained hereinafter in detail.

That is, the palletizing robot 20 is positioned at a desired position in such a manner that the motor 22a is operated in the travel driving unit 22 provided with the suspension frame 21 so as to rotate and drive the gears 22b, 22b, then, the suspension frame 21 is moved and driven through the gears 22b, 22b and the racks 11b, 11b engaged with the gears 22b, 22b in the direction as shown by the arrow A along the guide rails 11, 11, so as to stop by the brake function of the travel driving unit 22 Then, the suspension frame 21 is positioned at the position corresponding to the machined workpiece 70 to be carried from now on, on the classification head 5 (the position corresponding to the direction as shown by the arrows A and B above the machined workpiece 70).

Subsequently, the first frame 25 is moved and driven in the direction as shown by the arrows C and D along the movement rail 23 with respect to the suspension frame 21 in such a manner that the motor 26a is operated in the move driving unit 26 provided with the first frame 25 so as to rotate and drive the gear 26b, through the gears 26b and the rack 23a engaged with the gear 26b, and the first frame 25 is positioned at a desired position by the brake function of the move driving unit 26. Then, the first frame 25 is positioned at a position almost just above the machined workpiece 70 to be carried from now on, on the classification head 5.

Subsequently, each retention set aggregate 550 of four head units 45 is moved and positioned in horizontal two-dimensional direction above the machined workpiece 70, fitting in the form of the objective machined workpiece 70, for instance, as shown in FIG. 5. This movement positioning is executed by performing (a) rotation and positioning of the suspension frame 35, (b) rotation and positioning of the arm 47 and (c) sliding movement and positioning of the head frame 51, explained hereinafter.

(a). Rotation and positioning of the suspension frame 35. At first, the motor 36a is operated in the rotation driving unit 36 between the second frame 29 and the axis 33. By doing so, the pulley 36b is rotated and driven so as to rotate and drive the axis 33 with respect to the second frame 29 in the directions as shown by the arrows R1 and R2 in the figure with the rotational axis CT1 as its center.

In this way, by the rotation of the axis 33, the suspension frame 35 side is rotated and driven with respect to the second frame 29 side in the direction as shown by the arrows R1, R2 in the figure. And, when the suspension frame 35 side is rotated to a desired position, the suspension frame 35 side is stopped and positioned by the brake function of the rotation driving unit 36 side.

(b). Rotation and positioning of the arm 47. This is separately performed in each head unit 45. That is, in each head unit 45, the driving motor 49 provided with the bracket 46 is operated and the arm 47 is rotated and driven in the direction as shown by the arrows S and T in the figure with the rotational axis CT2 as its center through the output axis 49a. In this way, when the arm 47 is rotated to a desired position, the arm 47 is stopped and positioned by the brake function of the driving motor 49.

(c). Sliding movement and positioning of the head frame 51. This is also separately performed in each head unit 45. That is, the motor 52a of the slide driving unit 52 provided with the head frame 51 in the head unit 45 is operated so as to rotate and drive the gear 52b, and the head frame 51 is slid and moved in the direction as shown by the arrows P and Q along the rails for sliding 50, 50 through the rack 47a engaged with the gear 52b. When the head frame 51 is slid and moved to a desired position in this way, the head frame 51 is stopped and positioned by the brake function of the driving unit 52.

As explained before, by respectively performing (a), (b) and (c), or by performing one or two of the (a), (b) and (c), or by performing (b) and (c) concerning at least one of the four head units 45 when (b) and (c) are performed, each retention set aggregate 550 of the four head units 45 is moved and positioned in a horizontal two-dimensional direction with respect to the stationary second frame 29 side, that is, with respect to the machined workpiece 70 on the classification head 5, and is positioned, fitting the shape of the machined workpiece 70 to be carried from now on, as shown in FIG. 5, for instance. Thereafter, the motor 32a in the nut driving unit 32 of the first frame 25 is operated so as to rotate and drive each nut member 31 by the motor 32a, then each screw member 30 engaged with each nut member 31 is driven for the lower hand. Then, the second frame 29 side is moved and driven in the lower direction (the direction as shown by the arrow F in the figure) with respect to the first frame 25 side, being guided through a plurality of rods 27 and the guide holes 25a inserting these rods.

Figure 13:
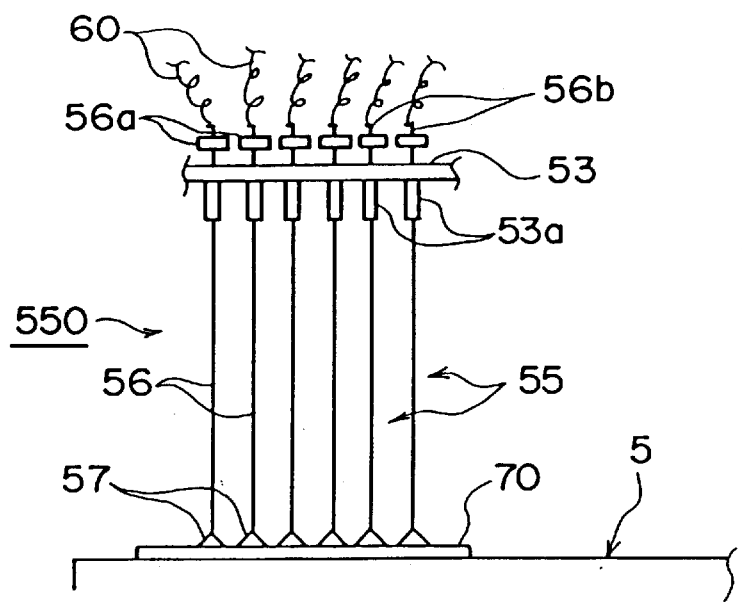
FIG. 13 is side view showing the way of retaining the machined workpiece by the retention set aggregate.

The moving and driving of the second frame 29 side with respect to the first frame 25 side is further continued. That is, the retention set aggregate 550 of the four head units 45 is brought down, and the nut driving unit 32 is stopped to operate in such a state that each pad 57 of these retention set aggregates 550 is abutted on the machined workpiece 70 on the classification head 5 so as to stop the movement of the second frame 29 side with respect to the first frame 25 side, as shown in FIG. 5. In this case, the descent of the second frame 29 side with respect to the first frame 25 side may be continued to some degree after each pad 57 of the retention set aggregate 550 is abutted on the machined workpiece 70, also. For instance, when the descent of the second frame 29 side with respect to the first frame 25 side is continued after each pad 57 is abutted on the machined workpiece 70, the head support portion 53 supporting a plurality of retention sets 55 is brought down as shown in FIG. 13 (The pad protecting member 59 and the like are omitted in FIG. 13).

However, each retention set 55 is free to move in the upper direction, relatively with respect to the head support portion 53, slidably moving the tube body 56. Then, the head support portion 53 is free to move in the lower direction, relatively with respect to each retention set 55. Accordingly, even if a plurality of retention sets 55 are abutted on the machined workpiece 70, and these retention sets 55 remain with respect to the machined workpiece 70 in this state, the head support portion 53 side is smoothly brought down without giving unpremeditated power to these retention sets 55. In this way, even if the movement quantity of the second frame 29 side with respect to the first frame 25 side is not specifically correct, the operation of abutting each pad 57 of the retention set aggregate 550 on the machined workpiece 70 is accurately and safely executed.

Since each retention set aggregate 550 of the four head units 45 are already positioned, fitting the shape of the objective machined workpiece 70, for instance, as shown in FIG. 5, as mentioned before, these retention set aggregates 550 are brought down to the machined workpiece 70, thereby many pads 57 of these retention set aggregates 550 are appropriately abutted on the machined workpiece 70, for instance, as shown in FIG. 5.

Figure 15:
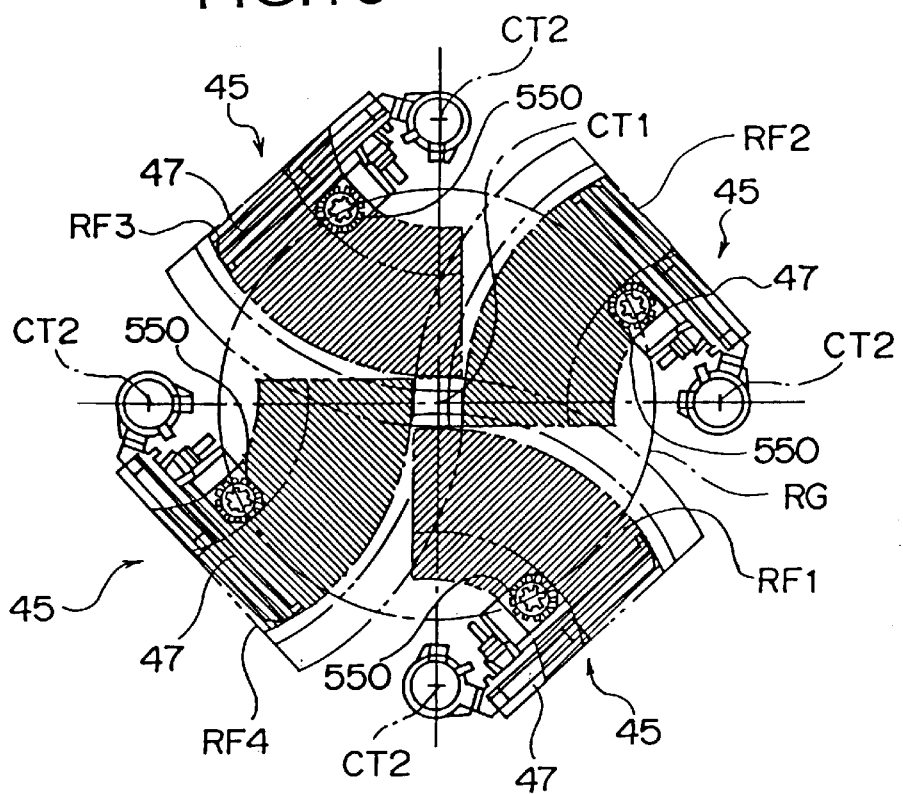
FIG. 15 is a top view typically showing the boundary capable of positioning of the four retention set aggregates.

On this occasion, as shown in FIG. 15, in the four head units 45 of the present embodiment, the rotational axis CT2 which is rotational center of each arm 47 are located at intervals of 90 degrees with the rotational axis CT1 of the axis 33 suspending the suspension frame 35 as its center on the same circumference, and the length of each arm 47 is slightly shorter than the distance between the rotational axes CT1 and CT2. Besides, since the retention set aggregate 550 of each arm 47 is free to move from the portion near the rotational axis CT2 of the arm 47 to the portion near the top end of the arm 47, the boundary RF1–RF4 capable of positioning each retention set aggregate 550 in a horizontal two-dimensional direction (in the level plane) is the boundary shown by the oblique line of FIG. 15 with each rotational axis CT2 as its standard, for instance (The two-dot chain line in FIG. 15 shows the locus which the arm 47 and the retention set aggregate 550 move). Besides, since the whole of each head unit 45 is rotated and moved with the rotational axis CT1 as its center by the rotational movement of the suspension frame 35 side with respect to the second frame 29 with the rotational axis CT1 as its center, as mentioned before, the boundary RG capable of positioning each retention set aggregate 550 in a horizontal two-dimensional direction (in the level plane) with the rotational axis CT1 as its standard is the boundary inside the circle with the rotational axis CT1 as its center, as shown in FIG. 15, for instance (shown by the dashed line of FIG. 15). That is, even if the machined workpiece 70 to be carried has any of shapes, the positioning of each retention set aggregate 550 with respect to this machined workpiece 70 is appropriately performed as long as the machined workpiece 70 to be carried is in the boundary RG of the lower hand of the suspension frame 35.

Figure 16:
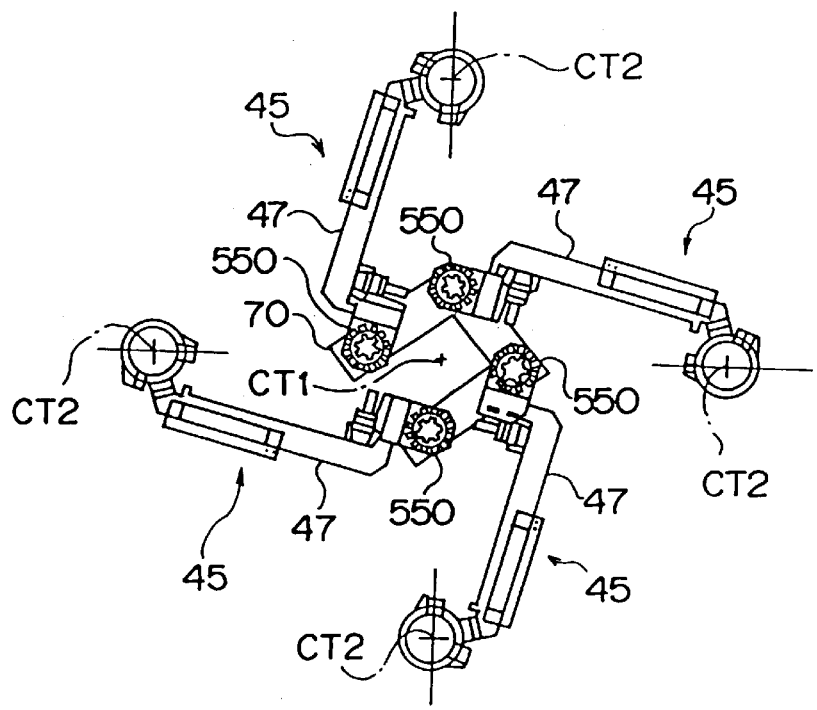
FIG. 16 is a top view typically showing an example of the pattern of positioning of the four retention set aggregates.
Figure 17:
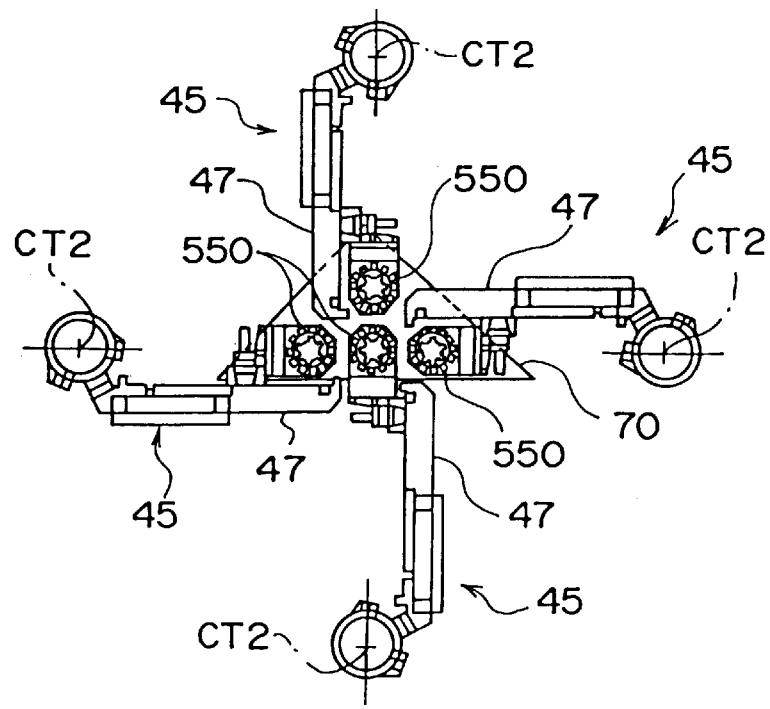
FIG. 17 is a top view typically showing an another example of the pattern of positioning of the four retention set aggregates.
Figure 18:
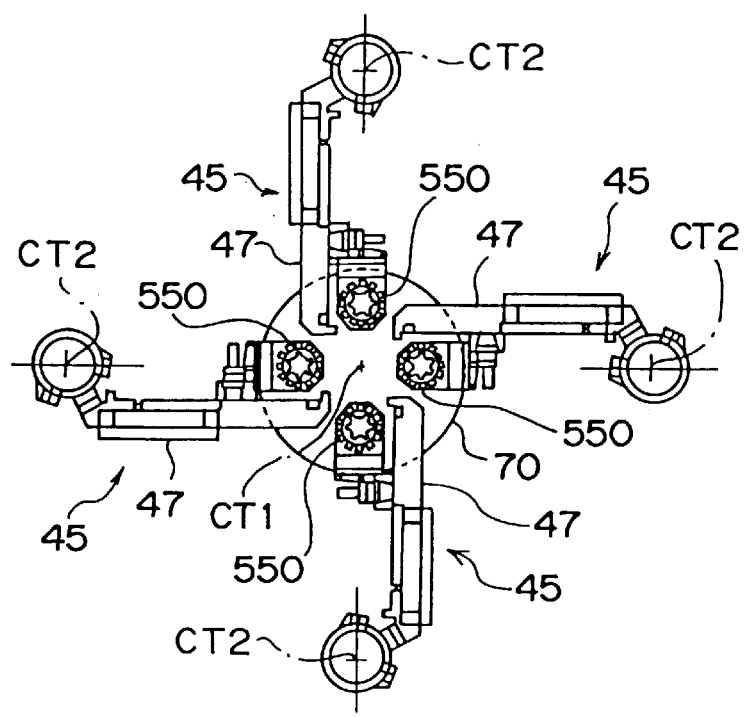
FIG. 18 is a top view typically showing an another example of the pattern of positioning of the four retention set aggregates; retention set

As shown in FIG. 16 (FIG. 5) or FIG. 18, for instance, the retention set aggregate 550 of the arms 47 is moved and positioned to the portion near the rotational axis CT1, gathering the top ends of each arm 47 to the portion near the rotational axis CT1, thereby the positioning of the retention set aggregate 550 with respect to the small workpiece 70 in the shape of U near the rotational axis CT1 (FIG. 16) and the circular workpiece 70 near the rotational axis CT1 (FIG. 18) is executed. As shown in FIG. 17 for instance, one retention set aggregate 550 (the retention set aggregate 550 of the lower side of the paper in the figure) is positioned further putting close to the rotational axis CT1 from the state of FIG. 18, thereby the positioning of the retention set aggregate 550 with respect to the small triangular workpiece near the rotational axis CT1 is executed.

Figure 19:
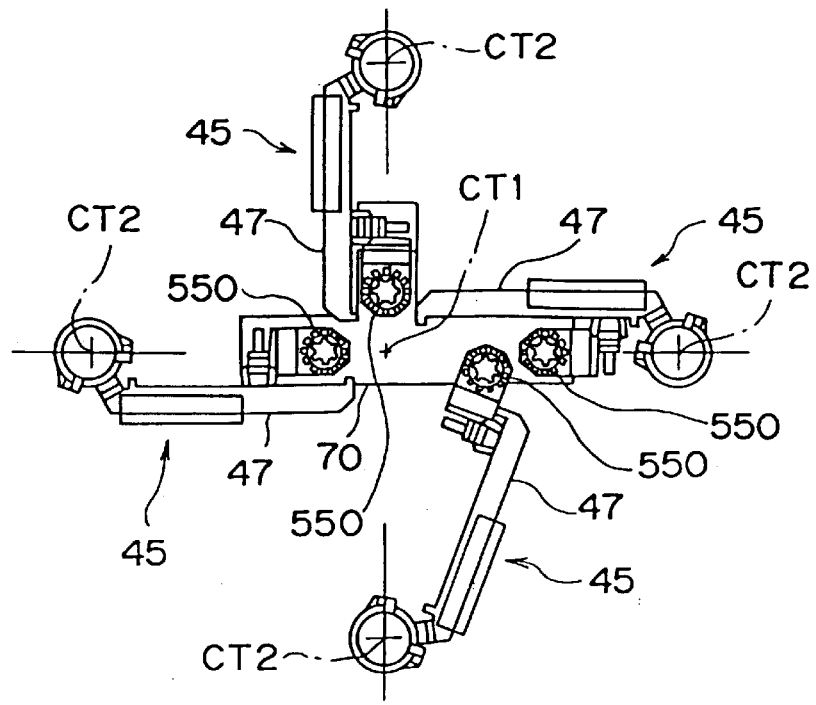
FIG. 19 is a top view typically showing an another example of the pattern of positioning of the four retention set aggregates.
Figure 21:
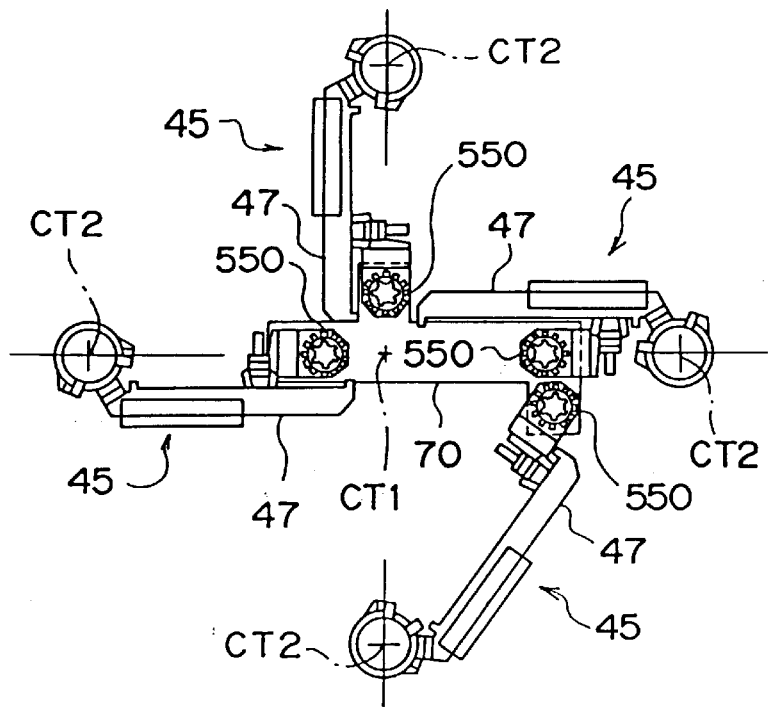
FIG. 21 is a top view typically showing an another example of the pattern of positioning of the four retention set aggregates.

As shown in FIG. 19 or FIG. 21, one arm 47 (the arm 47 of the lower side of the paper in the figure) is rotated and moved so as to keep away from the rotational axis CT1 from the state of FIG. 18, and the retention set aggregate 550 of the another arm 47 different from the precedent arm 47 (the arm 47 of the right side of the paper in the figure) is moved along the arm 47 so as to keep away from the rotational axis CT1, thereby the positioning of the retention set aggregate 550 with respect the workpiece 70 having complex shape, which is long and narrow in the right and left direction of the paper in the figure (the long and narrow shape having a projection) is executed.

Figure 20:
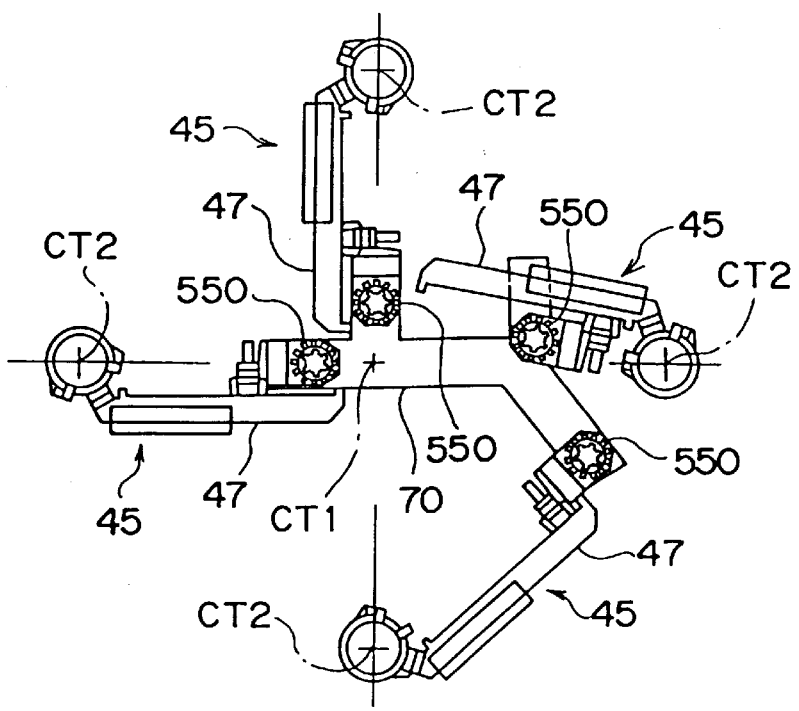
FIG. 20 is a top view typically showing an another example of the pattern of positioning of the four retention set aggregates.
Figure 22:
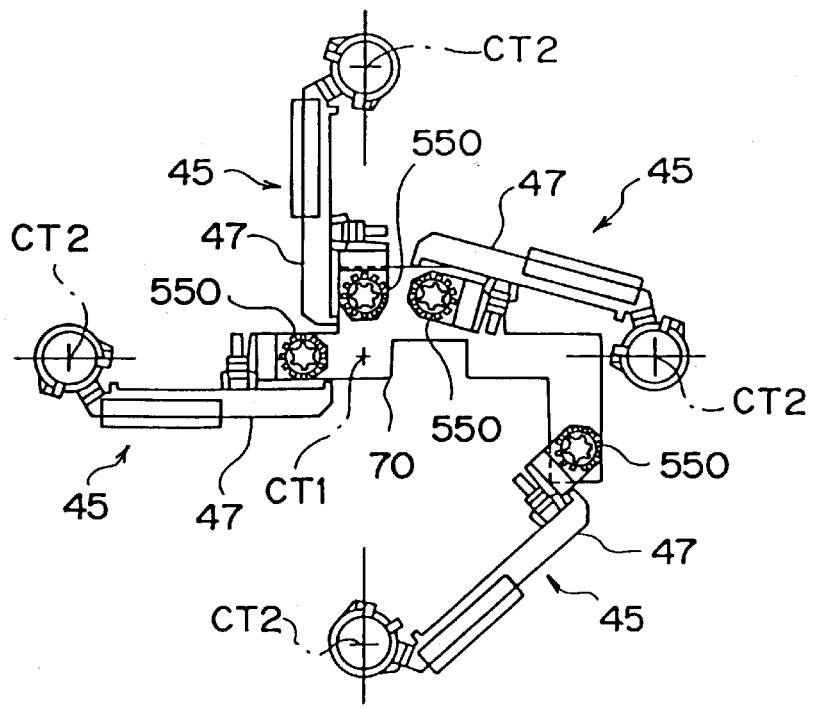
FIG. 22 is a top view typically showing an another example of the pattern of positioning of the four retention set aggregates.

Besides, as shown in FIG. 20, two arms 47 (the arms 47, 47 of the lower side and the right side of the paper in the figure) are rotated and moved so as to keep away from the rotational axis CT1 from the state of FIG. 19, thereby the positioning of the retention set aggregate 550 with respect to the workpiece 70 having further complex shape in comparison with the shape in FIG. 19 is executed. Besides, as shown in FIG. 22, two arms 47 (the arms 47, 47 of the lower side and the right side of the paper in the figure) are rotated and moved from the state of FIG. 18 so as to keep away from the rotational axis CT1, thereby the positioning of the retention set aggregate 550 with respect to the workpiece 70 which is longer in the right and left direction of the paper in the figure, having a complex shape, in comparison with the shape in FIG. 18 is executed. In addition to the abovementioned, the four retention set aggregates 550 are positioned with various patterns, which are not shown, thereby the Positioning with respect to the various workpieces having a complex shape can be executed.

Figure 11:
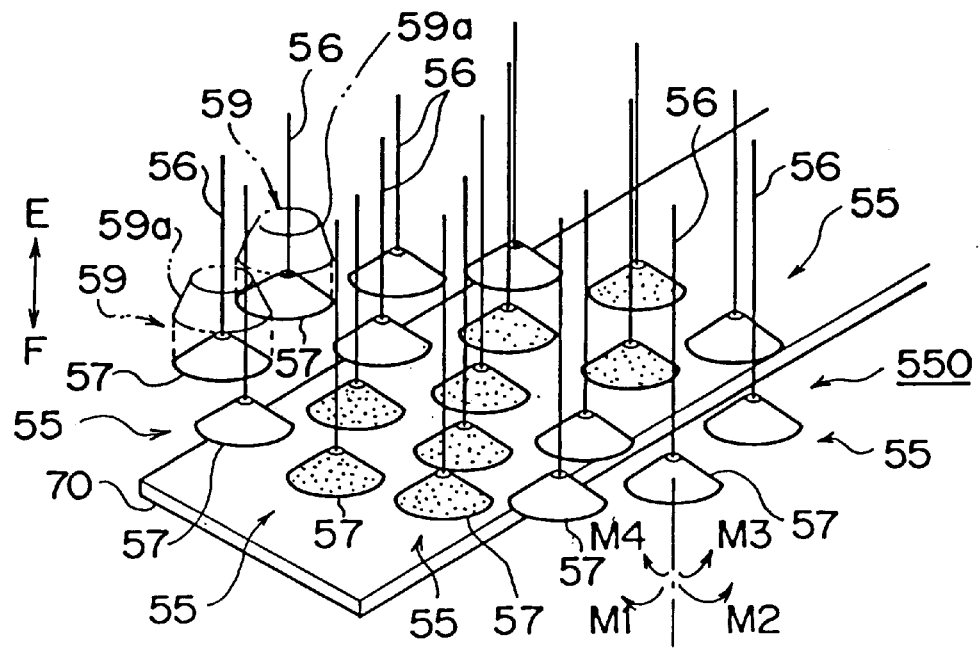
FIG. 11 is a view obliquely seen, showing the way of retaining a machined workpiece by the retention set aggregate.

After the four retention set aggregates 550 are positioned on the machined workpiece 70 as shown in FIG. 5, the retention of the workpiece 70 is performed. The vacuum pump 63 (FIG. 6) is operated in advance and the valve 65 of each pressure transfer member 62 is in the state of being closed. Then, the valve 65 of each pressure transfer member 62 is driven so as to be in the state of being open in order to retain the workpiece 70. By doing so, the pressure of the inside of each pad 57 connected with the vacuum pump 63 through the pressure transfer member 62, the tube 60 and the tube body 56 is decreased so as to generate suction force. Since each pad 57 abuts on the objective machined workpiece 70 as shown in FIGS. 5 and 13, suction force generates between the pad 57 and the workpiece 70 so as to retain the workpiece 70. On this occasion, in a plurality of pads 57 of one retention set aggregate 550 as shown in FIG. 11, there may be the pads 57 completely positioning on the workpiece 70 (the pads 57 having marking in the figure) or the pads 57 projecting from the workpiece 70 (which may be completely out of the workpiece 70 or a part of which may be out of the workpiece 70, having no marking in the figure). That is, in each pad 57, suction force separately generates. Therefore, the suction force to the workpiece 70 does not effectively generates in the pad 57 out of the workpiece 70, but in the pad 57 completely positioning on the workpiece 70, regardless of the pad 57 out of the workpiece 70, the air tightness between the pad 57 and the workpiece 70 is maintained and suction force effectively generates. Then, even if all of the pads 57 of the retention set aggregate 550 is completely certainly not on the workpiece 70, the suction force necessary for certainly retaining the workpiece 70 can be gotten. Therefore, even if the workpiece is one having a width smaller than the retention set aggregate 550 or one having fine and complex shape, the suction force effectively generates so as to retain the workpiece with no problem. Then, it is very convenient. When the workpiece is retained, the valve 65 is driven such that it becomes to be close state in the pressure transfer member 62 corresponding to the pads 57 out of the workpiece 70. By doing so, no vain suction force gives to the pad 57 to which effective suction force does not generate by the workpiece 70, and this energy can be saved. Besides, by doing so, the pad 57 out of the workpiece 70 can be prevented from retaining ones excluding the workpiece 70 to be retained, such as the classification head 5 and the other workpieces 70, or from retaining dust, so it is very convenient.

After the machined workpiece 70 is retained as mentioned before, the second frame 29 side is moved and driven with respect to the first frame 25 side in the upper direction (the direction as shown by the arrow E in the figure) by the nut driving unit 32 so as to raise the retained machined workpiece 70 to a predetermined height. Subsequently, the suspension frame 21 is moved and driven along the guide rails 11, 11 in the direction as shown in the arrow B by the travel driving unit 22 so as to stop the palletizing robot 20 at a desired position (the position matching to the pallet 10 of the workpiece stocker 9 to be delivered the retained machined workpiece 70 in the direction as shown by the arrows A and B).

Subsequently, the first frame 25 side is moved and driven with respect to the suspension frame 21 along the movement rail 23 in the direction as shown by the arrows C and D by the move driving unit 26 so as to move the retained machined workpiece 70 to a desired position (the position almost just above the position on the pallet 10 to be delivered the machined workpiece 70). Then, the first frame 25 side is stopped so as to position. Furthermore, the axis 33 is rotated and driven with respect to the second frame 29 in the direction as shown by the arrows R1 and R2 in the figure with the rotational axis CT1 as its center by the rotation driving unit 36, and the suspension frame 35 side is rotated and driven in the direction as shown by the arrows R1 and R2 in the figure so as to adjust the direction of the retained machined workpiece 70 in a desired direction.

Figure 12:
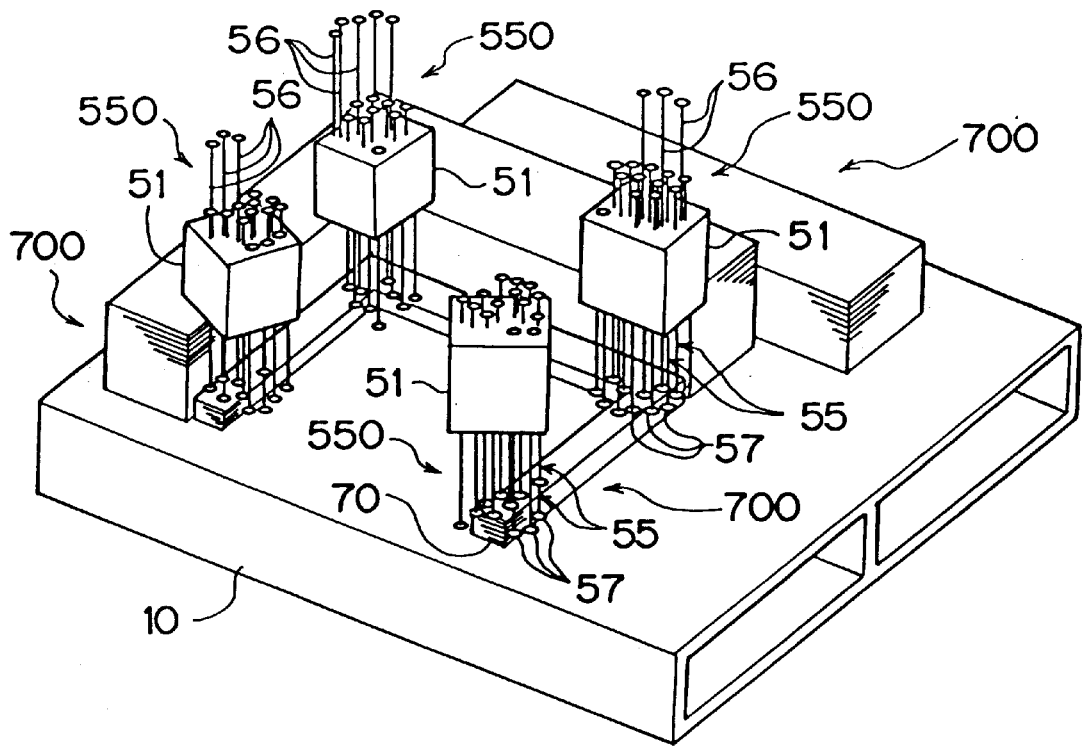
FIG. 12 is a view obliquely seen, showing the way of delivering the carried machined workpiece on a pallet.
Figure 14:
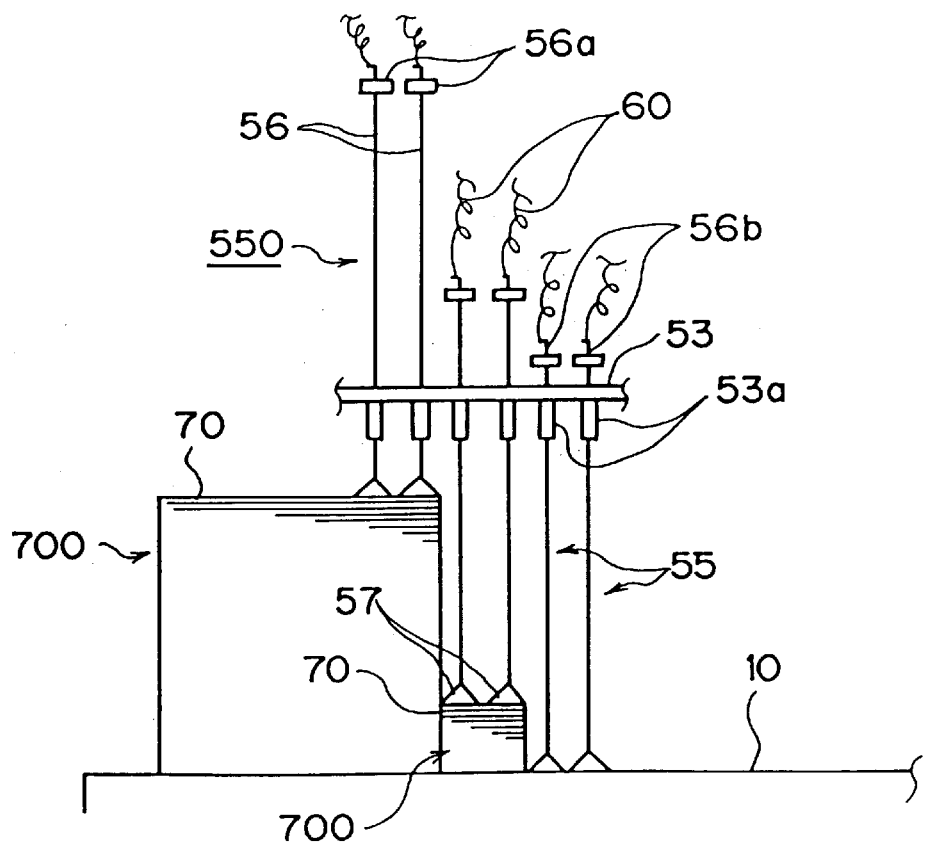
FIG. 14 is a side view, showing the way of delivering the carried machined workpiece on a pallet.

Subsequently, the second frame 29 side is moved and driven with respect to the first frame 25 side in the lower direction (the direction as shown by the arrow F in the figure) by the nut driving unit 32 so as to bring the retained machined workpiece 70 down on the pallet 10. Furthermore, the second frame 29 side is moved and driven with respect to the first frame 25 side in the lower direction so as to further bring the retained workpiece 70 down. Then, as shown in FIG. 12 (The retention set aggregate 550 and the simply shown head frame 51 are only shown on the palletizing robot 20 side for simplification in FIG. 12.) or as shown in FIG. 14 (The pad protecting member 59 and the like are omitted in FIG. 14), the workpiece 70 is put on a predetermined position on the pallet 10 (on the workpiece pile 700 already piled and put in the figure, but may be on the surface of the pallet 10). After putting, the valve 65 of each pressure transfer member 62 is made close so as to release the suction force between each pad 57 and the workpiece 70 and release the retention of the workpiece 70. Then, the retained carried workpiece 70 is delivered, putting on the workpiece pile 700 on the pallet 10.

On this occasion, after the retained machined workpiece 70 is put on the pallet 10 side, the movement and driving of the second frame 29 side with respect to the first frame 25 side in the lower direction may be continued to a degree.

When the movement and driving of the second frame 29 side with respect to the first frame 25 side in the lower direction is continued after the machined workpiece 70 is put on the pallet 10 side, the head support portion 53 supporting a plurality of retention sets 55 is further brought down as shown in FIG. 14 (The retention sets 55 retaining the workpiece 70 are two in the center of the paper in the figure.). However, since the head support portion 53 is free to move in the lower direction relatively with respect to each retention set 55 as explained before, the head support portion 53 can be brought down without prevention by these retention sets 55 even if each retention set 55 abuts on the workpiece 70 and the like and is not further moved in the lower direction and stopped. Then, the retention set 55 receives no unpremeditated power by the head support portion 53 and the like. That is, even if the movement quantity of the second frame 29 side with respect to the first frame 25 side is not specifically correct, the putting and the deliver of the retained machined workpiece 70 is appropriately performed. Then, it is very convenient. And, since a plurality of workpieces 70 is generally piled and put as the workpiece pile 700 on the pallet 10, the putting position of the workpiece 70 to be put thereon (the height level) is different depending on the height of the workpiece pile 700 already existent. However, even if the movement quantity of the second frame 29 side with respect to the first frame 25 side is not specifically correct in the palletizing robot 20 of the present embodiment as mentioned before, the retained workpiece 70 can be put on and delivered to a predetermined putting position(the height level). Therefore, even if the movement quantity of the workpiece 70 in the up and down direction at the time of descending is always set constant for instance, the putting and deliver of the workpiece 70 in the height level different according to respective cases can be appropriately performed. Therefore, the control of the movement quantity in the up and down direction is made simple, then it is convenient.

When the machined workpiece 70 is put and delivered, the carried workpieces 70 are put and delivered, making the workpiece piles 700 beside the already existent workpiece piles 700, as shown in FIG. 12 and FIG. 14, for instance, since it is necessary to classify many workpieces, effectively making use of the limited space on the pallet 10. In this example, the already existent another workpiece piles 700 exist, higher than the putting position to be put the retained workpiece 70 (the height level) just under the retention sets 55 which does not retain the workpiece 70 (two retention sets 55 of the left side of the paper in FIG. 14). Therefore, when the retained workpiece 70 is brought down, at first, the retention set 55 which does not retain the workpiece 70 (two retention sets 55 of the left side of the paper in FIG. 14) abuts on the upper face of another workpiece pile 700. However, when the descent of the workpiece 70 is continued as it is, only the retaining sets 55 abutting on the workpiece pile 700 remains to be in abutting condition, and is slidably moved in the upper direction relatively with respect to the head support portion 53. This is because each retention set 55 is individually free to move in the up and down direction relatively with respect to the head support portion 53 in one retention set aggregate 550. Therefore, the retention set 55 abutting on the workpiece pile 700 does not prevent the descent of the head support portion 53 side. On the contrary, these retention sets 55 receive no unpremeditated force from the head support portion 53 side. And, the retention sets 55 absorbing the workpiece 70 are brought down without hindrance, and the workpiece 70 can be put and delivered to a predetermined putting position. Even such a narrow place, the workpiece 70 can be appropriately delivered.

The pad protecting member 59 in each retention set 55 has a function of preventing from inadvertently retaining outside dust when suction force generates in the pad 57, in addition to preventing from damaging by colliding a plurality of pads 57 with one another in the retention set aggregate 550. After the positions of respective retention sets 55 are shifted in the up and down direction in the retention set aggregate 550 as shown in FIG. 14, the retention sets 55 which moves in the upper direction with respect to the head support portion 53 by raising the head support portion 53 side descend by the dead weight (may be compulsorily brought down by using a screw or the like) so as to match all of the retention sets 55 to the same height as shown in FIG. 6. On this occasion, the pad protecting member 59 of a plurality of pads 57 adjacent to one another has the taper portion 59a on its upper side. Therefore, when the pad protecting members 59, 59 adjacent to each other are shifted in up and down direction and are returned to the same height again, the lower end side of the pad protecting member 59 going down from the upper hand abuts on the taper portion 59a of the adjacent pad protecting member 59 which is in the lower hand, then the pad protecting member 59 slips down along this taper shape. Then, catching the pad protecting members 59, 59 each other can be prevented, so it is convenient.

Thereafter, by the routines similar to the above-mentioned, the palletizing robot 20 is traveled and moved in the direction as shown by the arrow A to the classification head 5 putting the workpiece to be carried next. The four retention set aggregates 550 are positioned, fitting the objective machined workpiece 70 on the classification head 5 by the movement and positioning of the first frame 25 with respect to the suspension frame 21 in the direction as shown by the arrows C and D, (a) the rotation and positioning of the suspension frame 35, (b) the rotation and positioning of the arm 47 and (c) slidably movement and positioning of the head frame 51. By bringing the second frame 29 side down with respect to the first frame 25, a plurality of pads 57 of each retention set aggregate 550 are abutted on the objective workpiece. Thereafter, the workpiece is retained by these pads 57. By raising the second frame 29 side with respect to the first frame 25, the palletizing robot 20 is traveled and moved to the workpiece stocker 9 in the direction as shown by the arrow B. The workpiece retained and carried by the rotation and positioning of the first frame 25 with respect to the suspension frame 21 in the direction as shown by the arrows C and D and the rotation and the positioning of the suspension frame 35 side is adjusted so as to match with the position to be put on the pallet 10 of the workpiece stocker 9. And, by bringing the second frame 29 side down with respect to the fist frame 25, the retained workpiece is put on the putting position, and the retention by the pads 57 is released. Then, the deliver finishes. By repeating such a series of operations, the machined workpieces 70 put on each classification head 5 in order are retained and carried in order so as to be put and delivered on the pallet 10 of each workpiece stocker 9.

As mentioned before, in the palletizing robot 20 of the present embodiment, a plurality of retention set aggregates 550 is provided, free to respectively move and position in the horizontal two-dimensional direction by (a) the rotation and positioning of the suspension frame 35, (b) the rotation and positioning of the arm 47 and (c) slidably movement and positioning of the head frame 51. Therefore, each retention set aggregate 550 can be appropriately positioned with respect to the workpiece having a complex shape, then, the workpiece can be retained and carried with no problem. Besides, each retention set aggregate 550 is comprised of a plurality of retention sets 55 which pads 57 are provided adjacent to each other. Then, suction force individually generates in the pads 57 of each retention set 55. Then, even if some pads 57 of the retention set aggregate 550 are out of the workpiece, the workpiece can be appropriately retained by the remainder pads 57. Then, the fine complex workpiece having the width smaller than the retention set aggregate 550, for instance, can be also retained, so it is very convenient.

In the above-mentioned embodiment, the tube body 56 and the pad 57 are fixedly connected in the retention set 55. But, as an another example, the tube body 56 and the pad 57 may be connected with an universal joint (not shown) or the like so as to rotate the pad 57 in all direction with respect to the tube body 56 (for instance, in the direction as shown by the arrow M1, M2, M3 or M4 shown in the right edge of the paper of FIG. 11). By doing so, even if the workpiece is one having an irregular portion by pressing machining or the like (not shown), the pads 57 are adjusted to the surface having the irregular portion by appropriately rotating each pad 57. Then, effective suction force can be generated between the pad 57 and the workpiece. So, the retention and carry of the workpiece having an irregular portion can be performed.

In the above-mentioned embodiment, the retention set aggregate 550 is free to move and position in a horizontal two-dimensional direction through the horizontal direction moving structure, which is comprised of the axis 33, the suspension frame 35, the rotation driving unit 36, the arm 47, the driving motor 49, the head frame 51, the slide driving unit 52 and the like. But, the horizontal direction moving structure may have another various structure. For instance, the arm having a flexible joint at a plurality of parts can be provided with the second frame 29 or the like so as to put the retention set aggregate 550 on the top end side of this arm.

Besides, in the above-mentioned embodiment, the tube body 56 in the retention set 55 is the member connecting and supporting the pad 57, being free to move in the up and down direction with respect to the head support portion 53, and is the retaining means for transferring reduction of pressure from the vacuum pump 63 side to the pads 57. But, as an another example, the slide member in the shape of a bar, which does not serve an retaining means may be adopted in place of the tube body 56, and the retaining means which is comprised of a tube or the like, connected with the vacuum pump 63 side, may be directly connected with the pad 57 connected with the slide member.

In the respective embodiments, the retention head is applied in the laser beam machining equipment. But, the suction head according to the present invention is not limited for only the laser beam machining equipment, and can be applied to the other type of machine tool equipment, also.

The present invention is explained on the basis of the embodiments heretofore. The embodiments which are described in the present specification are illustrative and not limiting. The scope of the invention is designated by the accompanying claims and is not restricted by the descriptions of the specific embodiments. Accordingly, all the transformations and changes belonging to the claims are included in the scope of the present invention.

What is claimed is:

1. A workpiece retention carrier unit, comprising:
   a machine body being free to move and drive at least in a horizontal direction;
   a head support rest provided with said machine body, being free to raise and to lower relative to the machine body, one or more suction means assembly provided with said head support rest, being free to move and position in a horizontal two-dimensional direction through a horizontal direction moving structure;

said suction means assembly having a plurality of suction means provided such that suction portions are adjacent to one another; and a suction driving means connected with each of said suction means.

2. The workpiece retention carrier unit as set forth in claim 1, wherein a plurality of said suction means assemblies are provided, and said assemblies are free to individually move and position in a horizontal two-dimensional direction through said horizontal direction moving structure.

3. The workpiece retention carrier unit as set forth in claim 1 wherein said suction means assembly is provided with respective suction means being free to individually move vertically.

4. The workpiece retention carrier unit as set forth claim 1 wherein said suction driving means has a suction control means for intermittently controlling the suction state of each suction means.

5. The workpiece retention carrier unit as set forth in claim 1 wherein said horizontal direction moving structure has a frame provided with said head support rest, being free to rotate and position, an arm provided with said frame, being free to rotate and position and a head mounting portion for mounting said suction means assembly, provided with said arm, being free to move and position in a horizontal direction.

6. A suction head, comprising:

a head body;

a plurality of suction means, provided with said head body;

a slide portion in the shape of a bar provided with each of said suction means, movably supported in an axial center direction with respect to said head body, being independent of another suction means;

suction portions located adjacent to one another when not retaining an object, the suction portions secured to a top end of each said slide portions;

vacuum units connected with each of said suction portions; and an intermittent suction control means provided with said air suction unit, capable of individually on-off controlling of suction operation of air to each of said suction portions.

7. The suction head as set forth in claim 6 wherein said slide portion in the shape of a bar is formed in the shape of a hollow tube, having air path therein, and said air path comprises a part of at least one of said vacuum units for absorbing air from each of said suction portions.

8. The suction head as set forth in claim 6 wherein each of said suction portions is universally jointed and supported with respect to said slide portion in the shape of a bar.

9. The suction head as set forth in claim 6 wherein a moving means of said head body is provided with said head body.

10. The suction head as set forth in claim 6 wherein each of said suction portions has a cover means for covering each of said suction portions and a tape portion is formed on said head body side of said cover means.

* * * * *

UNITED STATES PATENT AND TRADEMARK OFFICE
CERTIFICATE OF CORRECTION

PATENT NO.    : 6,311,966 B1
DATED         : November 6, 2001
INVENTOR(S)   : Akio Morishita et al.

It is certified that error appears in the above-identified patent and that said Letters Patent is hereby corrected as shown below:

<u>Title page,</u>
Item [73], the correct name of the assignee is -- Yamazaki Mazak Kabushiki Kaisha --.

Signed and Sealed this

Eighteenth Day of February, 2003

JAMES E. ROGAN
*Director of the United States Patent and Trademark Office*